United States Patent [19]
Card et al.

[11] Patent Number: 4,726,099
[45] Date of Patent: Feb. 23, 1988

[54] METHOD OF MAKING PIEZOELECTRIC COMPOSITES

[75] Inventors: Roger J. Card; Michael P. O'Toole, both of Stamford, Conn.; Ahmad Safari, State College, Pa.

[73] Assignee: American Cyanamid Company, Stamford, Conn.

[21] Appl. No.: 908,422

[22] Filed: Sep. 17, 1986

[51] Int. Cl.$^4$ .................. H01L 41/22; H01L 41/04
[52] U.S. Cl. .................. 29/25.35; 252/62.9; 310/358
[58] Field of Search .............. 29/25.35; 252/62 R; 310/357–359

[56] References Cited

U.S. PATENT DOCUMENTS

| | | | |
|---|---|---|---|
| 4,048,546 | 9/1977 | Bouchard et al. | 252/62.9 X |
| 4,227,111 | 10/1980 | Cross et al. | 29/25.35 X |
| 4,233,282 | 11/1980 | Arendt | 252/62.9 X |
| 4,234,558 | 11/1980 | Arendt et al. | 252/62.9 X |
| 4,330,593 | 5/1982 | Shrout et al. | 29/25.35 X |

*Primary Examiner*—Howard N. Goldberg
*Assistant Examiner*—Taylor J. Ross
*Attorney, Agent, or Firm*—Michael J. Kelly

[57] ABSTRACT

Piezoelectric ceramic polymer matrices, piezoelectric composites, and methods of make the matrices and composites are disclosed.

8 Claims, No Drawings

METHOD OF MAKING PIEZOELECTRIC COMPOSITES

FIELD

This invention relates to piezoelectric composites produced from solid or hollow ceramic fibers.

BACKGROUND

The present invention relates generally to piezoelectric transducers and, more particularly, to piezoelectric transducers utilizing two-phase, ceramic plastic composites and the method of producing such transducers.

There are certain transducer applications, such as the generation and detection of underwater acoustic signals or biomedical sensors, where it is highly desirable that the apparatus have the following properties: low density, high compliance, and high flexibility. A low density characteristic permits efficient acoustic coupling to the fluid medium and at the same time allows the transducer's buoyancy to be readily adjusted as compared to conventional ceramic piezoelectric materials. High compliancy improves the transducer's resistance to mechanical shock. It also provides high damping when the transducer operates in a passive mode. High flexibility is important when the transducer performs as a conformal detector.

There are basically two different procedures for developing a transducer material that possesses the above seemingly conflicting attributes. One involves investigating homogeneous materials. Polyvinylidene fluoride, $PVF_2$, is an example of such a substance. It has a high compliance and flexibility and its density is low compared to conventional ceramic piezoelectrics. However, because of its low piezoelectric strain coefficient, it has only limited value as an active device. Although its high voltage sensitivity indicates good performance as an active device, when used in this manner the material must be fixed to a curved surface which can flex in response to pressure changes. This requirement introduces difficulties in the design of the transducer, since a sealed flexible mounting for the polymer is needed that will function at extreme ocean pressures and still retain sensitivity near the surface.

A second approach involves the use of a composite material where advantage is taken of the different properties of each phase. A composite made of a polymer and lead zirconate titanate ceramic, PZT, is one choice. In such a composition, the polymer phase would lower the density and permittivity and increase the elastic compliance. If an elastomer is used, the composite would be compliant and flexible. If an epoxy is used, the transducer could perform as a resonator.

In the past elastomer/PZT composites have been produced for use as flexible, low density transducers. In these cases, the procedure has been to load a polymer film with particles of the piezoelectric material. The degree of flexibility and the magnitude of the piezoelectric strain and voltage coefficients, "d" and "g", are primarily controlled by the size of the piezoelectric particles in the heavily loaded elastomer film.

In one prior art transducer, the flexible composite was fabricated using 5 to 10 $\mu$m particles in a silicone rubber matrix. The longitudinal "d" values obtained in both cases were comparable to those of the piezoelectric $PVF_2$ material but the voltage sensitivities were lower because of the high permittivity in the composites. The difficulty with this type of composite, where the piezoelectric particles are smaller in diameter than the thickness of the polymer sheet, is that low permittivity polymer layers interleave the piezoelectric particles preventing saturation poling after the composite is formed. After some poling has been achieved, the inleaved compliant polymer attenuates the piezoelectric response of the composite.

Composites of the above type have also been fabricated with much larger pizoelectric particles, up to 2.4 mm in diameter, with the particle size approaching the thickness of composite. Since the piezoelectric particles extend from electrode to electrode, near saturation poling can be achieved. The large rigid piezoelectric particles in this arrangement transmit the applied strain so that high "d" values may be attained if this parameter is measured across the particles. This form of composite also exhibits permittivities that are low compared to homogeneous PZT, thus resulting in high "g" values. However, the problem with this composite construction is that its properties are extremely position sensitive.

It will thus be appreciated that an effective composite transducer cannot be fabricated by merely intermixing a polymer and piezoelectric ceramic particles. Not only must the composite contain component phases with the correct properties but additionally the constituent materials must be coupled in a manner which optimizes these properties in the composite. The mode of interconnection of each individual phase is of major importance since this feature controls the electric flux pattern and the mechanical stress distribution. A structure with interpenetrant phases connected in all three dimensions, it can be shown, provides the optimum connectivity.

This concept has been demonstrated with a variety of small composites which are carefully hand prepared for this purpose. To date, there is no convenient process to prepare larger samples for practical use.

A welcome contribution to the art would be a piezoelectric composite, as well as a method of making the same, which provides a flexible, low density electromechanical transducer; which is utilizable in the construction of a flexible hydrophone having a high hydrostatic sensitivity; in which a polymer phase (matrix) and a piezoelectric phase (ceramic fibers) are co-joined in such a manner that each individual phase is interconnected in either two or all three orthogonal dimensions, as desired; and which can be prepared by a process which is sufficiently flexible to allow control of the composition of the ceramic and/or polymeric materials, to control the extent of incorporation of ceramic materials and to allow the deliberate introduction of various reinforcements or other additives. Such a composite and a method for its production are provided by this invention.

SUMMARY OF THE INVENTION

This invention provides a ceramic polymer matrix composition suitable for use in peizoelectric composites comprising:
 (a) A piezoelectric ceramic material comprising fibers having a fiber outer diameter of less than about 50 microns, and
 (b) a polymer matrix.

This invention also provides a piezoelectric composite comprising:

(a) a piezoelectric ceramic material comprising fibers having a fiber outer diameter of less than about 50 microns
(b) a polymer matrix, and
(c) electrodes.

This invention further provides a method for producing a piezoelectric ceramic polymer matrix suitable for use in piezoelectric composites comprising:

(a) immersing activated carbon material comprising fibers having a fiber outer diameter of less than about 50 microns into a solution of metal salts or complexes capable of being calcined to oxides having piezoelectric properties, said carbon material capable of absorbing at least twice its weight in liquid, for from about 10 minutes to about 36 hours and at a pH ranging from about 3 to about 10, to thereby impregnate said carbon material with said metal salts or complexes,
(b) removing any excess solution of metal salts or complexes from said impregnated carbon material,
(c) drying the resultant, impregnated carbon material,
(d) calcining the dried impregnated carbon material to transform the salts or complexes to their oxide and remove the carbon material,
(e) recovering the resultant ceramic material, and
(f) intimately admixing a solution capable of being polymerized to a polymer material with said ceramic material, and with, optionally, the inclusion of reinforcing materials; or intimately admixing or imbedding said ceramic material in a polymer capable of forming a supporting matrix for said ceramic material, with, optionally, the inclusion of reinforcing material.

This invention aditionally provides a method for producing a piezoelectric composite comprising steps (a)-(f) of the method for producing a piezoelectric ceramic polymer matrix disclosed heretofore with the aditional steps:

(g) exposing, on opposite sides of said piezoelectric ceramic polymer matrix, a sufficient amount of ceramic material to attach electrodes thereto,
(h) attaching electrodes to said exposed ceramic material on opposite surfaces of said piezoelectric ceramic polymer matrix, and
(i) polarizing said piezoelectric ceramic polymer matrix thereby producing a piezoelectric composite.

The invention also provides transducers comprising the piezoelectric composites of this invention.

As used herein "activated carbon material" means any carbon based material that has been activated by known in the art procedures and includes fibers, non woven mats, woven mats, fibers (a multiplicity thereof) intertwined or wrapped together to form an individual structure comprising the multiplicity of fibers (for example, a yarn-like or rope-like intertwined or braided structure), and the like. The activated carbon material can be produced from individual activated carbon fibers, or the material can first be produced—e.g., using precursor fibers to produce mats or intertwined structures—and then activated, or the materials can be obtained commercially already in their desired structural form—e.g., mats—and then activated. Such versatility in the activated carbon material allows control of the microstructure of the compositions of this invention by classic textile processing technology.

As used herein "ceramic material" means any material resulting from the heretofore defined activated carbon material.

As used herein "piezoelectric ceramic" or "piezoelectric organic material" means any ceramic or organic material which can interconvert electric and mechanical energy.

DETAILED DESCRIPTION OF THE INVENTION

Generally, activated carbon materials are used as templates for the formation of piezoelectric ceramic materials. The ceramic fibers having a fiber outer diameter of less than about 50 microns and methods for their production are disclosed in copending application Ser. No. 908421 filing date 12-3-86, filed concurrently herewith and application Ser. No. 794,116, filed Nov. 5, 1985, the disclosures of both applications being incorporated herein by reference.

The resulting piezoelectric ceramic material is then placed in intimate admixture with a solution that can be polymerized to form a supporting polymer matrix for the piezolectric ceramic material, or the piezoelectric ceramic material is intimately admixed with or imbedded in a polymer capable of forming a supporting matrix for the piezoelectric ceramic material. The latter approach contemplates situations where the polymer is already formed and no polymerization is needed. Into this ceramic polymer matrix there can also optionally be included other reinforcing materials. Thus, a piezoelectric ceramic polymer matrix is produced.

The piezoelectric composite is then produced from the piezoelectric ceramic polymer matrix. This can be accomplished by exposing, on opposite surfaces, some of the piezoelectric ceramic material. To such material electrodes are attached on the opposite surfaces and the so formed unit is polarized thus producing a piezoelectric and pyroelectric composite.

These piezoelectric composites can then be used as transducers for a variety of applications.

The type and form of activated carbon material utilized is generally determined by the ultimate end use of the piezoelectric composite. Thus, for example, solid and/or hollow ceramic fibers having fiber diameters less than about 50 microns, and non woven or woven mats comprising such fibers can be used.

The metal salts and complexes utilized are those known in the art to yield crystalline structures having piezoelectric (and pyroelectric) properties. Such salts and complexes are preferably those from which highly concentrated aqueous or organic solutions can be made to produce high yields of ceramics. Examples of metals, whose salts or complexes can be used, include lead, zirconium, titanium, barium, lanthanum, manganese, magnesium, zinc, antimony, tellurium, iron, tantalum, tungsten, bismuth, niobium and the like. Preferred metals are lead, zirconium, titanium, barium, lanthanum, maganese, magnesium, zinc and niobium. Most preferred metals are lead, zirconium, titanium and barium. Preferred combinations are (a) lead, zirconium and titanium, (b) lead and titanium; (c) barium and titanium; and (d) lead, titanium, zirconium and niobium. As stated previously, ceramic fibers can be produced, as well as ceramic materials generally, by the methods of application Ser. No. 908421 Filing date 12-3-86, and application Ser. No. 794,116, utilizing those salts or complexes.

Generally each salt or complex is present in solution in an amount with the range of about 0.1 to about 40 wt % with about 1 to 33 wt % being preferred for the major metal components (by major it is meant that in the final ceramic material each metal is present in an amount of 5 to 75%. Trace additives, such as niobium, in amounts of 0.1 to 5%, can be used to produce piezoelectric composites for particular end uses (such as highly sensitive tactile sensors.

Organic solvents suitable for use for making the organic salt or complex solutions include for example methoxyethanol, tetrahydrofuran, ethanol, ethylacetate and the like.

The activated carbon material is usually immersed into metal salt or complex solutions maintained at a temperature within the range of about room temperature (i.e., about 20° C.) to about 100° C. and preferably about room temperature to about 75° C.

The piezolelectric ceramic material can be suitably arranged in any array or configuration in the polymer matrix desired. For example, piezoelectric ceramic material, in fiber form (solid or hollow) can be aligned substantially parallel to each, layer upon layer, to the desired thickness and the polymerizable solution can be poured onto the fibers to produce the piezoelectric ceramic polymer matrix. Or a woven or non woven cermaic mat can be placed in intimate contact with the polymerizable solution to produce the piezoelectric ceramic-polymer matrix composite. A preferred contemplated method, resulting in the production of large piezoelectric ceramic polymer matrix sheets from the piezoelectric ceramic fibers is electrostatic floccing which will align the fibers substantially parallel to each other and perpendicular to a two dimensional surface. Such a method is possible herein because of the high aspect ratio of the piezoelectric ceramic fibers a feature lacking in prior art fibers. For example, the piezoelectric ceramic fibers utilized herein when chopped to a length of at least 1 mm have aspect ratios greater than 100:1.

The polymer materials useable to form the supporting matrix for the piezoelectric ceramic materials are well known to those skilled in the art. Examples include silicone and epoxy resins and the like.

In one particular embodiment of the invention a woven mat of activated carbon fibers is allowed to soak in a solution containing salts or complexes of lead, zirconium and titanium. The excess solution is removed. The product is calcined at 500°–700° C. to remove the carbon and to convert the metal salts or complexes to their oxides or mixed oxides. This product is then sintered at high temperature to yield a piezoelectric woven mat of $Pb(Zr,Ti)O_3$.

This ceramic mat is then impregnated with a polymerizable material. The polymer is cured to yield a piezoelectric ceramic mat polymer matrix composite. Electrodes are applied to opposite faces of the matrix or pieces thereof. The piezoelectric ceramic is polarized to yield the piezoelectric composite.

In place of the woven mat of activated carbon fibers, individual activated carbon fibers, continuous or chopped, can be used as disclosed hereinabove to produce the ceramic material. In addition, any structure containing activated carbon materials, e.g., fibers, can be used. Examples of such structures include woven and non woven materials. The structure may contain other materials besides activated carbon materials. For example, chopped or continuous ceramic, metal or polymer (synthetic or natural) fibers may be incorporated into the structure, prior to the structures incorporation into the matrix, or into the matrix along with the ultimate ceramic structure as separate components for temporary or permanent reinforcement. Inorganic, metal, organic, polymeric or activated carbon powder fillers may also be added in the same manner.

The filler and reinforcement content of the hereinbefore mentioned structure may range from 0 to about 85 wt %, the remainder being activated carbon material. Preferably the activated carbon material is greater than 50 wt %. Similarly, when such fillers and reinforcements are incorporated into the matrix in separate components, their content is within the range of about 0 to about 75 wt % and preferably about 0 to 10% with the remainder being ceramic material.

The solution containing salts or complexes of lead, zirconium and titanium may be aqueous or organic. For example water, monoethylethers of ethylene glycol and monoalkylethers of propylkene glycol are suitable. Other organic solvents may be used so long as they can dissolve the metal salts or complexes to produce the desired concentration. Preferred solvents include water, 2-methoxyethanol, and methoxypropanol.

Generally, any soluble salt or complex of the metals can be used. Preferred systems include solutions which contain all of metals being utilized in the same solution in the desired concentrations. Examples include aqueous solutions of the metal citrates and monoalkylether glycol solutions of metal alkoxides.

The metals may be deposited in a single step or a sequence of steps. The metal salt or complex solutions may be the same in each step or different. The solution may contain one or more metal salts or complexes.

The following examples are provided for the purpose of illustration only. The examples should not be construed as limiting the invention in any way as variations of the invention are possible which do not depart from the spirit and scope of the appended claims.

In the examples that follow the activated carbon fibers were obtained from American Kynol or were prepared from Celanese Preox Fibers by known technology.

The nonwoven activated carbon felt used in Example 8 was obtained from American Kynol.

The woven activated carbon felt used in Example 9 was obtained from American Kynol.

EXAMPLE 1

Preparation of Aqueous Stock Solution of Lead, Titanium and Zirconium Citrates

Following the procedure of C. E. Li, et al in Ceramic Powders, P. Vincenzini, ed. 1983, p. 593–600:

(A) Lead (II) oxide (308 g, 1.37 moles) was added to an aqueous solution containing 430 g (2 moles) citric acid in 0.6 L water. The pH was maintained at ~9 by the addition of $NH_4OH$ during the process. The final solution volume was 1.2 L. The concentration of lead was 1.2M as determined by D.C. Plasma analysis.

(B) Zirconylchloride tetrahydrate (200 g, 0.8 mol) was added to 175 g (0.83 mol) citric acid in 0.125 L water. Ammonium hydroxide was added intermittantly to maintain a pH ~6. The final volume was 0.5 L. The zirconium concentration was 1.0M.

(C) Titanium butoxide (250 ml, 0.73 mol) was added to an aqueous solution of 250 g (1.2 mol) citric acid in 0.2 L $H_2O$ at pH=6 ($NH_4OH$) and 65°–70° C. The final volume was 0.6 L with a titanium concentration of 1M.

(D) These solutions were then combined to give a mixed citrate solution containing the desired molar ratio of the metals. For example, 0.42 L 1.2M lead citrate solution, 0.26 L 1M zirconium citrate solution and 0.22

L 1M titanium citrate solution were combined to yield 0.9 L mixed citrate solution with a molar ratio of Pb:Zr:Ti=1:0.54:0.46, respectively.

EXAMPLE 2

Preparation of Methoxyethanol Stock Solution of Lead, Titanium and Zirconium Alkoxides Lead (II) acetate trihydrate (600 g; 1.6 mol) was added to 1.5 L 2-methoxyethanol. The solution was heated and the water removed by distillation. The distillation was continued until the head temperature reached 120°–122° C. Titanium butoxide (257 g, 0.72 mol Ti) and 390 g (0.78 mol Zr) zirconium propoxide were added and the solution was concentrated by distillation to give ~1 kg solution. Analysis by D.C. Plasma indicates a Pb:Zr:Ti ratio of 1.0:0.53:0.47, respectively.

EXAMPLE 3

Preparation of Hollow PZT Fibers from the Aqueous Stock Solution of Metal Citrates 50 g activated carbon fibers were added to an excess of the aqueous solution of metal citrates described in Example 1 above. The mixture was allowed to stand overnight. The excess solution was removed by filtration. The fibers were dried at 110° C. for 3 hours to yield 112 g impregnated carbon fibers. D.C. Plasma analysis indicated a Pb:Zr:Ti ratio of 1.3:0.55:0.45. These fibers were calcined at 550° C. for 12 hours and then sintered at 1285° C. for 2 hours in a $PbO/ZrO_2$ environment to yield $Pb(Zr,Ti)O_3$ fibers.

EXAMPLE 4

Preparation of PZT Fibers from Methoxyethanol Solutions of Metal Alkoxides 25 g activated carbon fibers were added to 150 methoxyethanol solution of metal alkoxides as prepared in Example 2. The fibers were allowed to soak in the solution at 50° C. for 15 minutes. The excess solution was removed by filtration. The fibers were dried in vacuum to yield 118 g coated carbon fibers. Calcination at 500° C. for 16 hours resulted in formation of 35 g $Pb(Zr,Ti)O_3$ fibers containing a Pb:Zr:Ti ratio of 1:0.52:0.46. The fibers were sintered as described earlier to yield $Pb_{0.97}(Zr_{0.52},Ti_{0.48})O_3$.

EXAMPLE 5

Preparation of PZT Fibers from Methoxyethanol Solutions of Metal Alkoxides 25 g activated carbon fibers were added to 150 g methoxyethanol solutions of metal alkoxides as prepared in Example 2 and 75 g ethanol. The fibers were allowed to soak for 40 minutes. The excess solvent was removed by filtration. The fibers were dried under vacuum and then calcined at 500° C. for 16 hours to yield 20 g $Pb(Zr_{0.52}Ti_{0.48})O_3$. The fibers were sintered at previously described to yield $Pb_{0.99}(Zr_{0.53}Ti_{0.47})O_3$.

EXAMPLE 6

Preparation of PZT Fibers from Methoxyethanol Solutions of Metal Alkoxides 20 g activated carbon fibers were added to soak in 67 g methoxyethanol solution of metal alkoxides as prepared in Example 2 and 67 g ethanol for 20 minutes. The excess solution was removed by filtration and the fibers were dried under vacuum. The fibers were allowed to soak in fresh solution of the alkoxides and dried three additional times. Calcination at 500° C. for 16 hours yielded 40 g $Pb(Zr_{0.52}Ti_{0.48})O_3$. Sintering under standard conditions yielded $Pb_{0.99}(Zr_{0.52}Ti_{0.48})O_3$ fibers.

EXAMPLE 7

Preparation of PZT Fibers from Methoxyethanol Solutions of Metal Alkoxides 150 g alkoxide solution such as Example 2 was diluted with 75 g ethanol. Niobium ethoxide (1.5 g) was added. 20 g activated carbon fibers were then allowed to soak in the resultant solution for 50 minutes. Drying, calcination and sintering was in accordance with the procedure of Example 4. Calcination yielded $Pb_{1.05}(Zr_{0.52},Ti_{0.48},Nb_{0.02})O_x$. Sintering yielded $Pb_{0.9}(Zr_{0.52},Ti_{0.48})O_x \cdot 1$ mole % $Nb_2O_5$. The exact value of x has not been determined but is believed to be about 3, i.e. in the range of about 2.5 to 3.5. The same value shall be used in subsequent examples unless otherwise indicated.

EXAMPLE 8

Preparation of PZT Structures

Following the procedure of Example 7, except as indicated, 20 g of a nonwoven activated carbon felt was allowed to soak in a methoxyethanol solution of lead, zirconium, titanium and niobium alkoxides at 70°–80° C. for 20 minutes. The excess solvent was removed and the process was repeated. Calcination at 500° C. for 1 hour and 600° C. for 90 minutes yielded 110 g $Pb_{0.85}(Zr_{0.54},Ti_{0.46})O_x \cdot 1$ mol % $Nb_2O_5$. The sample was sintered under standard conditions.

EXAMPLE 9

Preparation of PZT Structures

Following the procedure of Example 8, except as indicated, 12 g of a woven activated carbon mat was converted to 58 g $Pb_{0.9}(Zr_{0.53}Ti_{0.47})O_x \cdot 1$ mol % $Nb_2O_5$.

EXAMPLE 10

Formation of PZT Fiber-Polymer Matrix and Piezoelectric Composites (A) The $Pb(Zr,Ti)O_3$ fibers prepared in Example 3 were loosely aligned together in a pile and then impregnated with Spurrs Epoxy. The polymer matrix was cured to yield a PZT Fiber-Epoxy matrix composite. This composite was sliced to yield a 0.95 mm thick sample with most of the fibers oriented perpendicular to the highest area surface (the 3 direction). Silver paint electrodes were applied to opposite surfaces of the sample. The sample was poled across the 3 direction at 60–70 kV/cm at 75° C. for 15 minutes to produce a piezoelectric composite C=3.95 pF; $d_{32}$(avg)=115 pC/N; $g_{33}$=0.1 Vm/N; tan $\delta$=0.029; and $K_{33}$=105.

(B) A 3mm thick sample was also prepared and polarized across the 3 direction at 33 kV/cm at 75° C. for 15 minutes. The data obtained was as follows: C=11.25 pF; $d_{33}$(avg)=55 pC/N; $g_{33}$=0.06 Vm/N; tan $\delta$=0.013; and $K_{33}$=102.

This example demonstrates that the composites of this invention have good piezoelectric performance. For comparison, $d_{33}$ for pure (no matrix, no composite) $Pb(Zr_{0.55}Ti_{0.45})O_3 \cong 150$ pC/N and $K_{33}$=1400. For PZT fiber-polymeric composites $K_{33}$ is usually proportional to volume percent PZT in the composite. The value of $K_{33}$ for the 0.95 mm composite of this invention of ~105 indicates less than 10 vol % PZT in the composite yields $d_{33}$ value ~75% of that of the pure ceramic material.

EXAMPLE 11

Piezoelectric Composites

Piezoelectric composites were prepared from the PZT fibers prepared in Example 7 and Spurrs Epoxy according to the procedure of Example 10. The data are reported in Table 1. The data show that $d_{33}$ increases with increasing $K_{33}$ and (for D) with the addition of niobia. The samples also have low loss tangent and good hydrostatic performance.

EXAMPLE 12

Fibers from Example 6 were converted to an eccogel matrix and then to a piezoelectric complex following the procedure of Example 10. The matrix was poled at 40 kV/cm to yield piezoelectric composites with the following properties: $K_{33}=225$; $d_{33}=200$ pC/N; $g_{33}=100\times10^{-3}$ Vm/N; dh=30 pC/N; gh=$15\times10^{-3}$ Vm/N; and tan $\delta=0.09$. Use of eccogel results in better $d_{33}$, $g_{33}$ performance but poorer hydrostatic performance relative to Spurrs Epoxy. This piezoelectric composite would therefore be preferred for above water applications.

TABLE 1

| PIEZOELECTRIC COMPOSITE PERFORMANCE DATA | | | | |
|---|---|---|---|---|
| SAMPLE | A | B | C | D |
| Poling Voltage (kV/cm) | 26 | 35 | 40 | 40 |
| $K_{33}$ | 160 | 188 | 190 | 220 |
| $d_{33}$ (max) (pC/N) | 145 | 165 | 185 | 265 |
| $d_h$ (pC/N) | 30 | 35 | 38 | 46 |
| $g_h$ ($10^{-3}$Vm/N) | 22 | 21 | 25 | 25 |
| tan $\delta$ | 0.008 | 0.011 | 0.012 | 0.022 |

EXAMPLE 13

Piezoelectric Composites

Following the procedure of Example 10 the nonwoven PZT mats and woven PZT prepared in Examples 8 and 9 were converted to Spurrs Epoxy matrix and eccogel matrix composites. The composites were polarized to form piezoelectric composites (A–F) and the piezoelectric performance data are reported in Table 2. These results demonstrate that PZT structures can be readily prepared from activated carbon structures, that these materials can be readily converted to polymer matrix composites and piezoelectric compositions, and that these materials have good piezoelectric performance.

TABLE 2

| PIEZOELECTRIC COMPOSITE PERFORMANCE DATA | | | | | | |
|---|---|---|---|---|---|---|
| SAMPLE | A | B | C | D | E | F |
| PZT Material | Example 8 | Example 8 | Example 8 | Example 9 | Example 9 | Example 9 |
| Matrix Material | Epoxy | Eccogel | Eccogel | Epoxy | Eccogel | Eccogel |
| Poling Voltage | 60 | 50 | 40 | 66 | 40 | 60 |
| $K_{33}$ | 50 | 50 | 25 | 38 | 48 | 54 |
| $d_{33}$ (ave) | 55 | 140 | 75 | 25 | 90 | 100 |
| $g_{33}$ (ave) | 124 | 316 | 338 | 74 | 211 | 209 |
| $d_h$ | 6 | 8 | 4 | 6 | 30 | 44 |
| $g_h$ | 14 | 18 | 15 | 18 | 70 | 21 |
| tan $\delta$ | 0.017 | 0.08 | 0.07 | 0.017 | 0.09 | 0.08 |

What is claimed is:

1. A method for producing a piezoelectric ceramic polymer matrix suitable for use in piezoelectric composites comprising:
    (a) immersing activated carbon material comprising fibers having a fiber outer diameter of less than about 50 microns into a solution of metal salts or complexes capable of being calcined to oxides having piezoelectric properties, said carbon material capable of absorbing at least twice its weight in liquid, for from about 10 minutes to about 36 hours and at a pH ranging from about 3 to about 10, to thereby impregnate said carbon material with said metal salts or complexes,
    (b) removing any excess solution of metal salts or complexes from said impregnated carbon material,
    (c) drying the resultant, impregnated carbon material,
    (d) calcining the dried impregnated carbon material to transform the salts or complexes to their oxide and remove the carbon material,
    (e) recovering the resultant ceramic material, and
    (f) intimately admixing a solution capable of being polymerized to a polymer material with said ceramic material, and with, optionally, the inclusion of reinforcing materials; or intimately admixing or imbedding said ceramic material in a polymer capable of forming a supporting matrix for said ceramic material, with, optionally, the inclusion of reinforcing material.

2. A process of claim 1, wherein said carbon material is a woven or non woven mat, or is a fiber comprising a multiplicity of fibers intertwined or wrapped together.

3. A process of claim 1 wherein said solution comprises salts or complexes of metals selected from the group consisting of said ceramic comprises metals selected from the group consisting of: lead, zirconium, titanium, barium, lanthanum, manganese, magnesium, zinc, antimony, tellurium, iron, tantalum, tungsten, bismuth, and niobium.

4. A process of claim 3 wherein said solution is an organic solution.

5. A process of claim 4 wherein said solution is 2-methoxyethanol.

6. A process of claim 1 wherein said solution comprises salts or complexes of the metals (a) lead, zirconium, and titanium, (b) lead and titanium, (c) barium and titanium, or (d) lead, zirconium, titanium and niobium.

7. A process of claim 1 said reinforcing filler is selected from the group consisting of said reinforcing filler is selected from the group consisting of ceramic, metal or polymer fibers and inorganic, metal, organic, polymeric or activated carbon powders.

8. A process of claim 1 having the additional steps of
    (g) exposing, on opposite sides of said piezoelectric ceramic polymer matrix, a sufficient amount of ceramic material to attach electrodes thereto,
    (h) attaching electrodes to said exposed ceramic material on opposite surfaces of said piezoelectric ceramic polymer matrix, and
    (i) polarizing said piezoelectric ceramic polymer matrix thereby producing a piezoelectric composite.

* * * * *